(12) United States Patent
Tan et al.

(10) Patent No.: US 7,694,886 B2
(45) Date of Patent: Apr. 13, 2010

(54) RFID TAG AND MANUFACTURING PROCESS THEREOF

(75) Inventors: Kunihiro Tan, Hyogo (JP); Kazuhiro Yoneda, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 127 days.

(21) Appl. No.: 11/493,570

(22) Filed: Jul. 27, 2006

(65) Prior Publication Data

US 2007/0023517 A1 Feb. 1, 2007

(30) Foreign Application Priority Data

Aug. 1, 2005 (JP) .............................. 2005-222415

(51) Int. Cl.
*G06K 19/00* (2006.01)
(52) U.S. Cl. ...................... 235/487; 235/488; 235/492
(58) Field of Classification Search ................. 235/492, 235/488, 487
See application file for complete search history.

(56) References Cited

U.S. PATENT DOCUMENTS 5,396,698 A * 3/1995 Orthmann et al. ............. 29/600
6,930,646 B2 * 8/2005 Yahata et al. ............... 343/718

2004/0159709 A1 * 8/2004 Ohta et al. ................... 235/492
2005/0179552 A1 * 8/2005 Shoji et al. ................ 340/572.7

FOREIGN PATENT DOCUMENTS

| JP | 9-204506 A | 8/1997 |
| JP | 2002-252518 A | 9/2002 |
| JP | 2005-019471 A | 1/2005 |

* cited by examiner

*Primary Examiner*—Daniel A Hess
*Assistant Examiner*—Paultep Savusdiphol
(74) *Attorney, Agent, or Firm*—Dickstein Shapiro LLP

(57) ABSTRACT

An RFID tag comprises a semiconductor chip storing therein information of an object to be discriminated and carrying out radio communication with a reader/writer device; and an antenna coil provided with a magnetic core member and connected electrically to the semiconductor chip. The semiconductor chip and the magnetic core member are wrapped by an insulation sheet carrying an interconnection pattern connecting a pad of the semiconductor chip and the antenna coil electrically and plural coil patterns on one side thereof. The plural coil patterns includes bar-shaped conductor patterns formed obliquely to the magnetic core member, each of the bar-shaped conductor patterns having an end connected to an end of an adjacent coil pattern, the bar-shaped conductor patterns thereby forming together a spiral coil around the magnetic core member. The coil patterns being connected with each other at a part where the coil patterns overlap with each other.

11 Claims, 12 Drawing Sheets

RFID TAG AND MANUFACTURING PROCESS THEREOF

The present invention generally relates to RFID tags, and more particularly to an RFID tag capable being formed with reduced thickness, assembled with fewer number of steps and capable of providing reliable electric connection. Further, the present invention provides the manufacturing process thereof.

In view of compact size and low cost and further in view of the capability of handling overwhelmingly large amount of information, RFID tags are used in various products and goods in recent years.

An RFID tag includes a memory area allowing reading and writing via a reader/writer device. Typically, this memory area is used to store various discrimination information of the object, such as model number, price, date of manufacture, usable period, guarantee period, recycle information, and the like.

Such information is written and read out by a reader/writer device.

Because RFID tags are used in a wide variety of objects, there is a demand of compact size and thin shape for RFID tags. Also, there is a need of high reliability and low cost.

An RFID tag includes a semiconductor chip storing the discrimination information of the object and an antenna coil connected electrically to the semiconductor chip. Thus, when the antenna coil receives an electromagnetic wave of a particular frequency band from a reader/writer device, the semiconductor chip is activated.

Conventional RFID tags can be divided into two types according to the structure of the antenna coil. The one being the type that forms the antenna coil as a separate body by winding a conductor applied with insulation coating around a magnetic body. Thereby, the lead wires extending out the antenna coil are connected to a circuit substrate on which the semiconductor chip is mounted.

The other being the type, in which a loop form antenna coil is formed on the same circuit substrate, on which the semiconductor chip is mounted, by using a conductor pattern. With this type, connection between the semiconductor chip and the antenna coil is achieved by a conductor pattern on the circuit substrate.

With the former approach, a circuit substrate mounted with a semiconductor chip is assembled into a case of a RFID tag together with a ferrite core and an antenna coil. Thereby, the coil is soldered to the circuit substrate and the case is filled with a resin. Thus, this approach has a drawback of using large number of parts and necessitating large number of assembling steps, while this causes increase of cost. Further, because the use of soldering for connection between of the coil to the circuit substrate, there arises a problem of poor reliability of electric connection. Further, it is general with such an approach to use an antenna coil formed by winding a conductor wire carrying thereon an insulation coating around a ferrite member constituting a magnetic core, while such a construction increases the thickness of the antenna, and it is difficult to realize compact and thin RFID tag.

Patent Reference 1 discloses "antenna coil and fabrication process for RFID", wherein Patent Reference 1 discloses an improvement of antenna of this type.

As shown in the plan view and cross-sectional view of FIGS. 13A and 13B, the invention disclosed in Patent Reference 1 forms a coil body by plural front side conductors 23 disposed on the front side of a flat plate-like magnetic core member 21 and plural rear side conductors 24 disposed on a rear surface thereof. By connecting the rear side conductors with the front side conductors electrically at respective ends, the technology of Patent Reference 1 achieves an extremely thin antenna coil. Further, Patent Reference 1 discloses formation of the front side conductors 23 and the back side conductors 24 by way of conductor patterns formed on an insulation sheet 22.

The latter approach, on the other hand, improves the reliability of the RFID tag by eliminating the soldering work between the antenna coil and the circuit substrate as in the case of "ID tag" disclosed in Patent Reference 2.

Referring to FIGS. 14A and 14B respectively showing the ID tag of this reference in a plan view and cross-sectional view, a circuit part 32 and a coil substrate 33, on which an antenna coil 34 is to be formed, constitute a unitary body substrate 31 with the invention disclosed in Patent Reference 2, and thus, there is no longer the need of soldering the antenna coil to the circuit part.

With the construction of FIGS. 14A and 14B, the circuit part 32 is defined by a pair of cutout parts 33a formed in the coil substrate 33, and thus, the circuit part 32 is formed in connection with the coil substrate 33 at two bridging parts 33b. Further, a ferrite core 34 is mounted upon the coil substrate 33 in the state in which the coil substrate 33 is accommodated in a case 35, in such a manner that an inner frame part 34e of the ferrite core 34 makes engagement with the foregoing two cutout parts and an outer frame part 34b of the ferrite core 34 surrounds the outer rim of the coil substrate 33. Thereby, there is formed a cutout in the ferrite core member 34 over the coil substrate 33 so as to expose the circuit part 32, and the antenna coil is formed on the coil substrate 33 in correspondence to a part 34a of the ferrite core 34 between the inner frame part 34e and the outer frame part 34b. The coil substrate 33 is thereby encapsulated in the case 35 by a resin 37.

Patent Reference 1 Japanese Laid Open Patent Application 2002-252518 official gazette Patent Reference 2 Japanese Laid-Open Patent Application 9-204506 official gazette

SUMMARY OF THE INVENTION

However, even when the antenna coil disclosed in Patent Reference 1 is used, there is achieved no improvement with regard to the problem of large number of parts and large number of assembling steps or low reliability of the connection between the antenna coil and the circuit substrate mounted with the semiconductor chip.

Further, with the construction disclosed in Patent Reference 2, in which the case 35 is filled with the resin 37 after the ferrite core 34 and the coil substrate 33 are incorporated therein, there is achieved no substantial reduction in the number of parts or assembling steps. Further, because of the construction of piling the coil substrate and the ferrite core, it is not possible to reduce the thickness of the RFID tag.

The present invention has been made in view of the problems noted above and has its object of providing a highly reliable RFID tag capable of reducing the thickness and capable of reducing the number of assembling steps.

In order to achieve the above object, the present invention provides, in a first mode thereof, an RFID tag, comprising:

a semiconductor chip storing therein information of an object to be discriminated and carrying out radio communication with a reader/writer device; and an antenna coil provided with a magnetic core member and connected electrically to said semiconductor chip, said semiconductor chip and said magnetic core member being wrapped by an insulation sheet carrying an interconnection pattern connecting a pad of said semiconductor chip and said antenna coil electrically and plural coil patterns on one side thereof, said plural coil patterns including bar-shaped conductor patterns formed obliquely to said magnetic core member, each of said bar-shaped conductor patterns having an end connected to an end of an adjacent coil pattern, said bar-shaped conductor patterns thereby forming together a spiral coil around said magnetic core member, said coil patterns being connected with each other at a part where said coil patterns overlap with each other.

According to a first mode of the present invention, it is preferable that the semiconductor chip and the magnetic core member are wrapped by a single insulation sheet folded in such a manner that said interconnection pattern and said coil patterns are formed on an inner surface of said folded insulation sheet. Alternatively, said insulation sheet comprises a lower insulation sheet part on which a part of said coil patterns and said interconnection pattern are formed and an upper insulation sheet part on which remaining part of said coil patterns are formed. Thereby, the semiconductor chip and the magnetic core member are wrapped by a lower insulation sheet and an upper insulation sheet that are put together.

Further, in order to attain the foregoing object, the present invention provides, in a second mode thereof, an RFID tag, comprising:

a semiconductor chip holding therein information of an object to be discriminated and carrying out radio communication with a reader/writer device; and an antenna coil provided with a magnetic core member and connected electrically to said semiconductor chip, said semiconductor chip and said magnetic core member being wrapped by an insulation sheet carrying thereon an interconnection pattern and plural coil patterns, said interconnection pattern connecting a pad on said semiconductor chip and said antenna coil electrically, said insulation sheet being folded around said semiconductor chip and said magnetic core member in such a manner that said interconnection pattern and said coil patterns are carried on an inner side of said insulation sheet, each of said plural coil patterns having a bar-shaped form and disposed so as to extend across said magnetic core member in an oblique direction with regard to a crease line formed on said folded insulation sheet, said plural coil patterns forming together a spiral around said magnetic core member by overlapping an end thereof with an end of an adjacent coil pattern, each of said plural coil patterns having said end electrically connected to said end of said adjacent coil pattern.

In any of the first and second modes noted before, it is preferable that there is disposed a rewritable thermal paper at a side of said insulation sheet opposite to a side on which said semiconductor chip is mounted.

Further, in order to attain the foregoing object, the present invention provides, in a third mode thereof, an RFID tag comprising:

a semiconductor chip holding therein information of an object to be discriminated and carrying out radio communication with a reader/writer device; and an antenna coil provided with a magnetic core member and connected electrically to said semiconductor chip, said semiconductor chip and said magnetic core member being wrapped by a first insulation sheet and a second insulation sheet that are put together, said first insulation sheet carrying, on an inner surface thereof, an interconnection pattern for connecting a pad of said semiconductor chip to said antenna coil and plural first coil patterns constituting said antenna coil, said second insulation sheet carrying, on an inner surface thereof, plural coil patterns constituting a part of said antenna coil, each of said first and second coil patterns comprising a bar-shaped conductor pattern extending across said magnetic core member obliquely, each of said bar-shaped conductor patterns constituting said first coil patterns having a first end and a second, opposite end such that said first end overlaps with a corresponding end of an adjacent bar-shaped conductor pattern forming said second coil patterns and such that said second end overlaps with a corresponding end of another adjacent bar-shaped conductor pattern forming said second coil patterns, said first and second coil patterns forming thereby a spiral around said magnetic core member, each of said bar-shaped conductor patterns constituting said first and second coil patterns being connected electrically to respective, adjacent bar-shaped conductor patterns at said first end and at said second end.

In the third mode of the present invention, it is preferable to dispose a rewritable thermal paper at a surface opposite to a surface of said second insulation sheet put to said first insulation sheet.

Further, in order to attain the foregoing object, the present invention provides, in a fourth mode thereof, a method of manufacturing an RFID tag, said RFID tag comprising a semiconductor chip holding therein information of an object to be discriminated and carrying out radio communication with a reader/writer device, and an antenna coil provided with a magnetic core member and connected electrically to said semiconductor chip, said method comprising the steps of:

forming, on a surface of an insulation sheet, an interconnection pattern for connecting a pad of said semiconductor chip to said antenna coil and bar-shaped coil patterns constituting said antenna coil;

connecting said pad of said semiconductor chip to said interconnection pattern electrically;

applying an adhesive to said surface of said insulation sheet on which said interconnection pattern and said coil patterns are formed;

disposing a magnetic core member on a predetermined location of said insulation sheet so as to form a predetermined angle with regard to said bar-shaped coil patterns;

wrapping said semiconductor chip and magnetic core member by said insulation sheet such that said surface of said insulation sheet on which said interconnection pattern and said bar-shaped coil patterns are formed forms an inner surface;

connecting overlapping parts of said bar-shaped coil patterns electrically such that there is formed a coil would around said magnetic core member by said bar-shaped coil patterns as said antenna coil; and adhering said insulation sheet to said semiconductor chip and said magnetic core member under pressure.

In the fourth mode of the present invention, it is preferable to dispose a rewritable thermal paper on a surface of the insulation sheet opposite to the surface on which the semiconductor chip is mounted.

Further, in order to attain the foregoing object, the present invention provides, in a fifth mode thereof, a method of manufacturing an RFID tag, said RFID tag comprising a semiconductor chip holding therein information of an object to be discriminated and carrying out radio communication with a reader/writer device, and an antenna coil provided with a magnetic core member and connected electrically to said semiconductor chip, said method comprising the steps of:

forming, on a surface of a first insulation sheet, an interconnection pattern for connecting a pad of said semiconductor chip to said antenna coil and plural first coil patterns constituting a part of said antenna coil;

forming plural second coil patterns constituting a part of said antenna coil on a surface of a second insulation sheet;

connecting a pad of said semiconductor chip and said interconnection pattern;

applying an adhesive to said surface of said first insulation sheet on which said first coil patterns are formed and to said surface of said second insulation sheet on which said second coil patterns are formed;

disposing a magnetic core member to a predetermined location of said first and second insulation sheets such that said first and second coil patterns form a predetermined angle with regard to said magnetic core member;

putting said first and second insulation sheets together and wrapping said semiconductor chip and said magnetic core member by said first and second insulation sheets such that said surface of said first insulation sheet on which said first coil patterns are formed and said surface of said second insulation sheet on which said second coil pattern are formed form an inner surface; and connecting said first and second coil patterns at respective end parts where said first and second coil patterns overlap with each other, such that said antenna coil formed of said first and second coil patterns is would around said magnetic core member; and adhering said first insulation film and said second insulation film to said magnetic core member under pressure.

In the fifth mode of the present invention, it is preferable to dispose a rewritable thermal paper on a surface of said second insulation sheet opposite to a surface on which said first insulation sheet is adhered under pressure.

In any of the fourth and fifth modes of the present invention, it is preferable to adhere, in the step of electrically connecting the overlapping parts of the coil patterns, the coil patterns under pressure by forming a hole penetrating through overlapping two coil patterns by a needle-like tool.

According to the present invention, it becomes possible to provide a highly reliable RFID tag suitable for reducing the thickness while reducing the number of manufacturing steps.

DETAILED DESCRIPTION OF THE INVENTION

First Embodiment

Hereinafter, explanation will be made on a first embodiment of the present invention.

Figure 1:
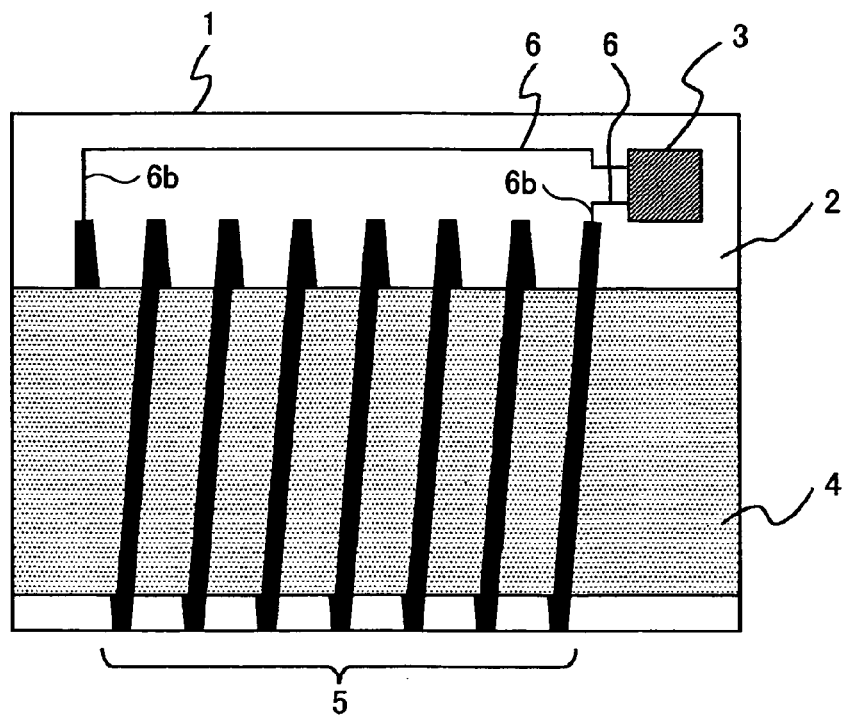
FIG. 1 is a diagram showing the construction of an RFID tag according to a first embodiment of the present invention.
Figure 2:
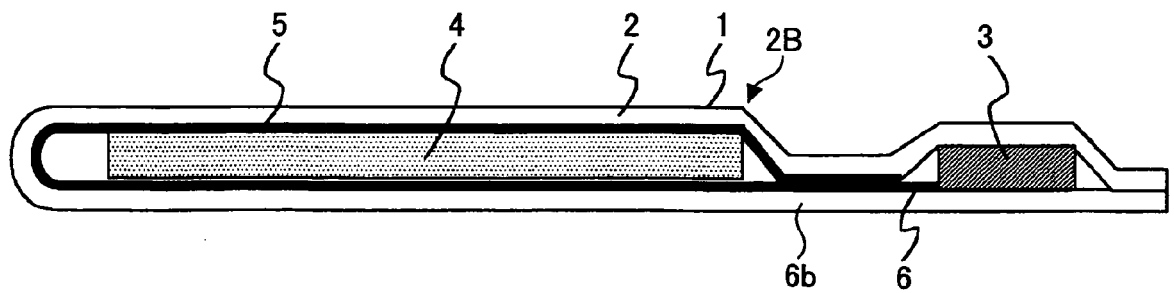
FIG. 2 is a diagram showing the construction the RFID tag of the first embodiment in a cross-sectional view.

FIG. 1 shows the construction of an RFID 1 of to the present embodiment, while FIG. 2 shows the cross-sectional structure of the RFID tag 1.

Referring to FIGS. 1 and 2, the RFID tag 1 includes an insulation sheet 2, a semiconductor chip 3, a magnetic core member 4, a coil pattern 5 and an interconnection pattern 6, wherein the coil pattern 5 and the semiconductor chip 3 are formed on the same side of the insulation sheet 2, and the insulation sheet 2, carrying thereon the coil pattern 5, covers the semiconductor chip 3 and wraps around the magnetic core member 4.

Figure 3:
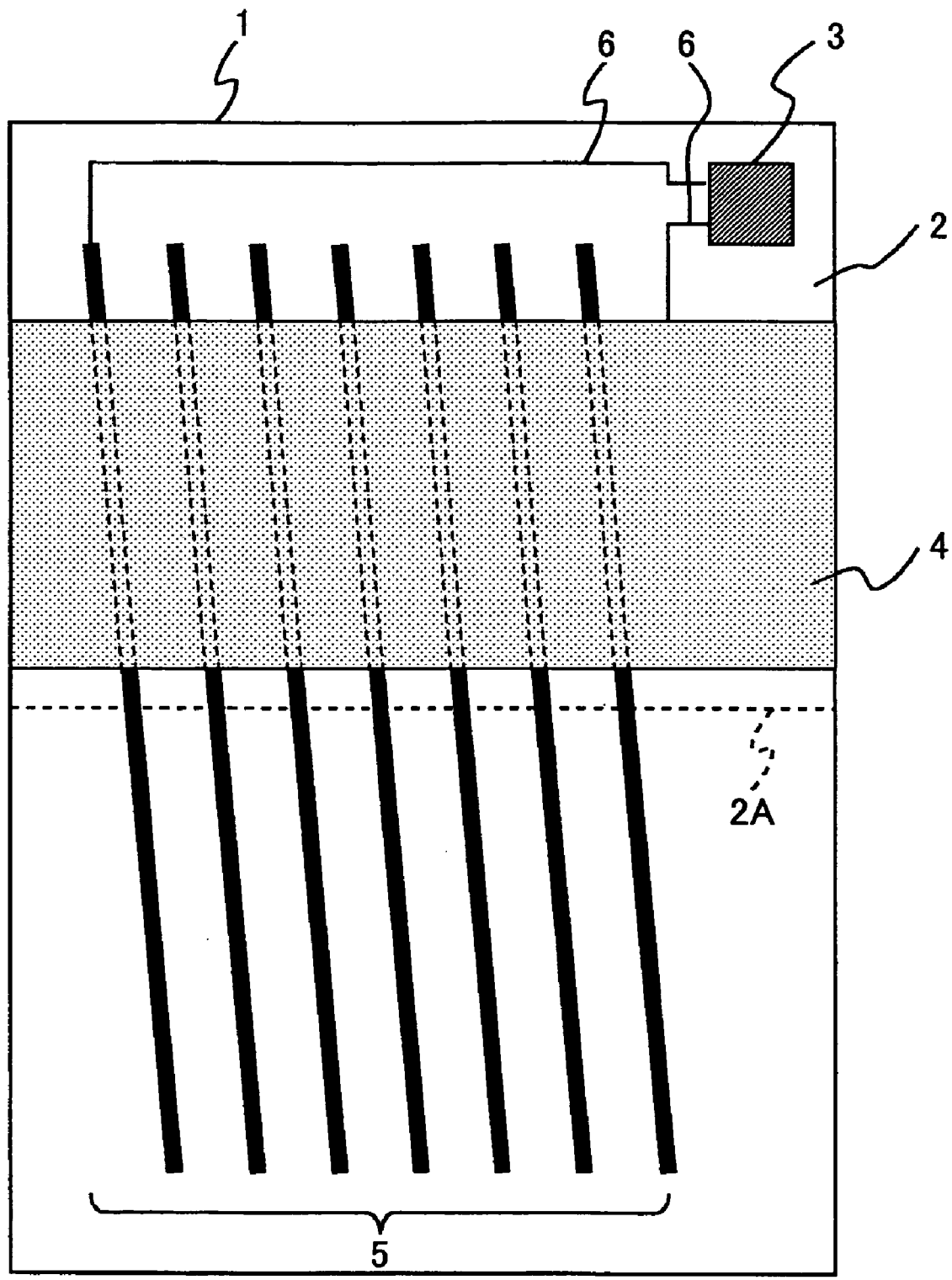
FIG. 3 is a diagram showing the RFID tag of the first embodiment before completion of assembling.

FIG. 3 shows the RFID tag 1 in the state before completion of the assembling.

Referring to FIG. 3, it can be seen that there are formed parallel, bar-shaped conductor patterns forming together a coil pattern 5 on one side of the insulation sheet 2, and another conductor pattern forming the interconnection pattern 6 is formed on the same side of the insulation sheet 2. Such conductor patterns may be formed by bonding a conductor foil to the insulation sheet 2, followed by an etching process or by way of a printing process conducted by using a conductive ink, or alternatively by a metallization process of a conductive material on the insulation sheet 2.

The magnetic core member 4 has a generally rectangular shape and is disposed on the insulation sheet 2 of the state before being folded so as to divide the insulation sheet 2 to one-half in the width direction thereof at a mid point of the longer edge.

The coil pattern 5 is formed of plural bar-shaped conductor patterns disposed in parallel as noted before. Thereby, it should be noted that the conductor patterns forming the coil pattern 5 are disposed obliquely with regard to the edge of the magnetic core member 4, in such a manner that, an end point of a first conductor pattern coincides with a start point of an adjacent conductor pattern in the event the insulation sheet 2 is folded about a creasing line 2A shown in FIG. 3 by a dotted line. Because the coil pattern 5 provides lower resistance and higher antenna efficiency with increase of the conductor width, the conductor patterns forming the coil patter 5 are formed with larger width as compared with the interconnection pattern 6.

Figure 8:
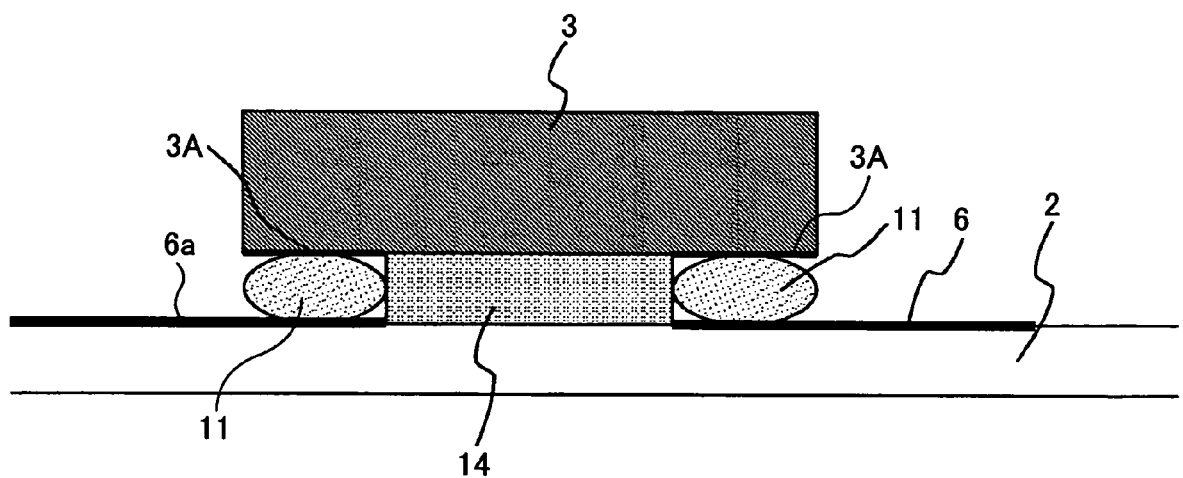
FIG. 8 is a diagram showing an example of connection between a semiconductor chip and an interconnection pattern.

It should be noted that the interconnection pattern 6 includes a pattern part 6a making electrical contact with a pad 3A of the semiconductor chip 3 as shown in FIG. 8, and a pattern 6b shown in FIGS. 1 and 2 is connected electrically to the end parts of the coil pattern 5 formed of the plural conductor patterns.

Hereinafter, assembling of the RFID tag 1 will be explained.

First, the semiconductor chip 3 is mounted upon one side of the insulation sheet carrying thereon the interconnection pattern 6 in the form of a conductor pattern. Mounting of the semiconductor chip 3 may be achieved by attaching the semiconductor chip 3 to the insulation sheet 2 by an adhesive 14 as shown in FIG. 8 and further by connecting the pad 3A of the semiconductor chip 3 to the pattern part 6a of the interconnection pattern 6 by a conductive adhesive 11.

Figure 9:
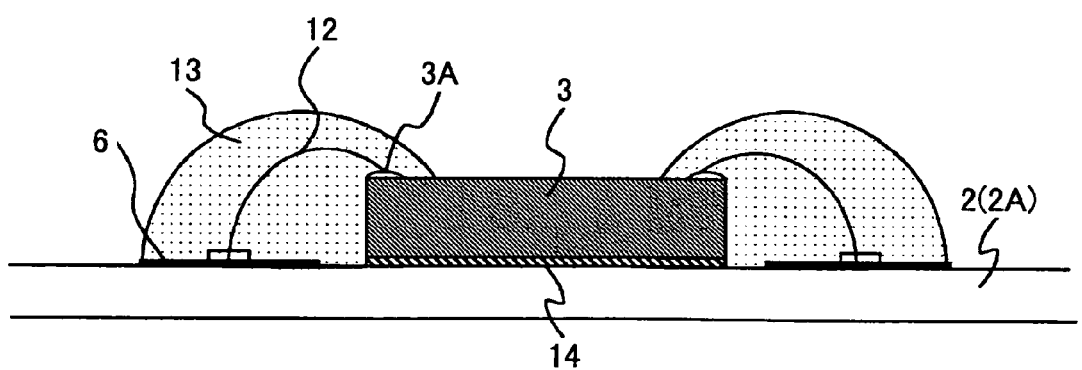
FIG. 9 is a diagram showing an example of connection between a semiconductor chip and an interconnection pattern.

Alternatively, it is possible to connect the pad 3A to the interconnection pattern 6 by bonding wires 12 as shown in FIG. 9. In this case the bonding wires 12 may be protected by filing a potting resin 13.

Figure 10:
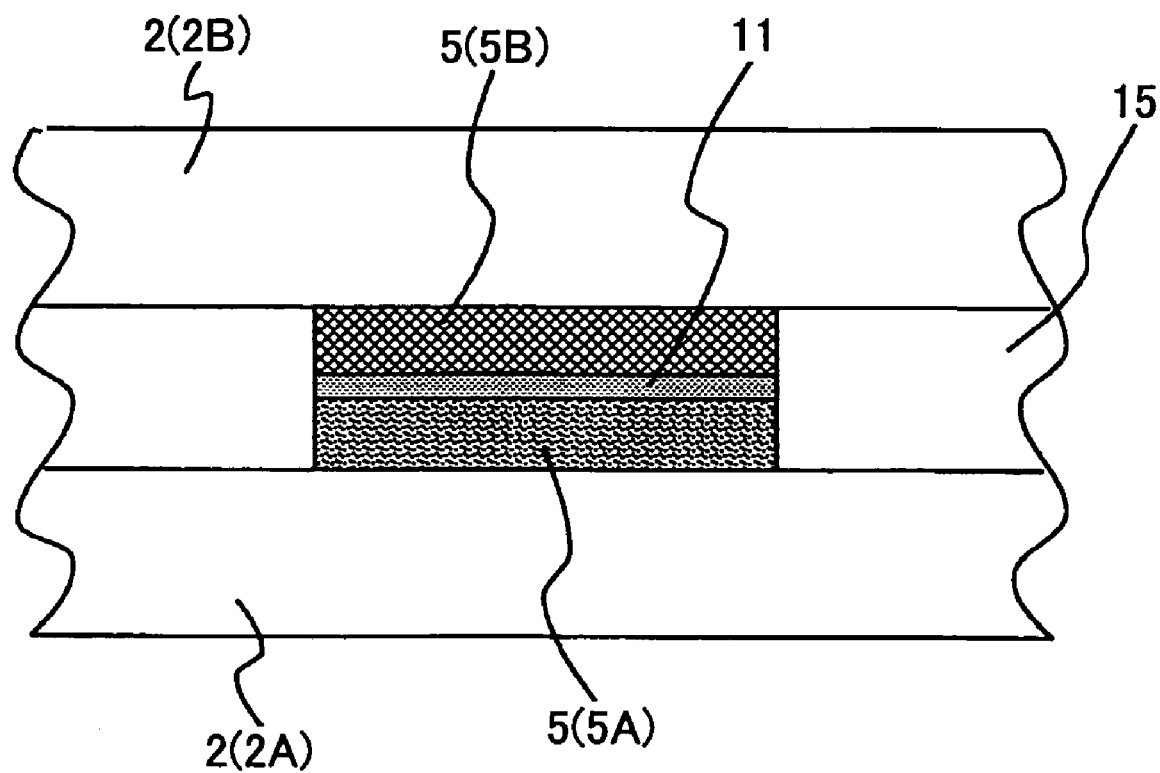
FIG. 10 is a diagram showing an example of connection between coil patterns.

After mounting the semiconductor chip 3, an adhesive is applied as shown in FIG. 10 to the surface of the insulation sheet 2 on which the conductor patterns are formed to form an adhesive layer 15.

Thereby, it should be noted that the magnetic core member 4 is disposed over the coil pattern 5 as shown in FIG. 3 such that the core member 4 is located between the creasing line 2A of the insulation sheet 2 and the semiconductor chip 3. Thereby, it is preferable to place the magnetic core member 4 as close to the creasing line 2A as possible. The magnetic core member 4 should disposed such that the edge part of the conductor patterns forming the coil pattern 5 at the side closer to the semiconductor chip 3 is not covered by the magnetic core member 4.

Next, the insulation sheet 2 is folded about the creasing line 2A such that the magnetic core member 4 is wrapped by the base part of the insulation sheet 2 on which the magnetic core member 4 is provided and the folded part of the insulation sheet 2. Thereby, it is preferable that the folded part of the insulation sheet 2 is creased further along a creased line 2B corresponding to the edge of the magnetic core member 4 as shown in FIG. 2 such that the end part of the conductor patterns constituting the coil pattern 5 on the folded part of the insulation sheet 2 makes an intimate contact with the corresponding end part of the conductor patterns of the coil pattern 5 on the base part of the insulation sheet 2.

Here, it should be noted that, as a result of folding of the insulation film 2, the end part of a conductor pattern forming the coil pattern 5 is overlapping with the end part of an adjacent conductor pattern forming the coil paten 5, and thus, by connecting such overlapping parts electrically, there is formed a continuous spiral coil by the coil pattern 5.

As noted already, the folded part of the insulation sheet 2 is further creased at the edge of the ferrite core member 4 as shown in FIG. 2, such that the end part of the conductor patterns forming the coil pattern 5 makes contact with the end part of the conductor patterns of the coil pattern 5 on the base part (lower) of the insulation sheet 2 in a parallel relationship.

The overlapping parts of the conductor patterns forming the coil pattern 5 can be connected with each other electrically by using a conductive adhesive 11 as shown in FIG. 10.

Figure 11A:
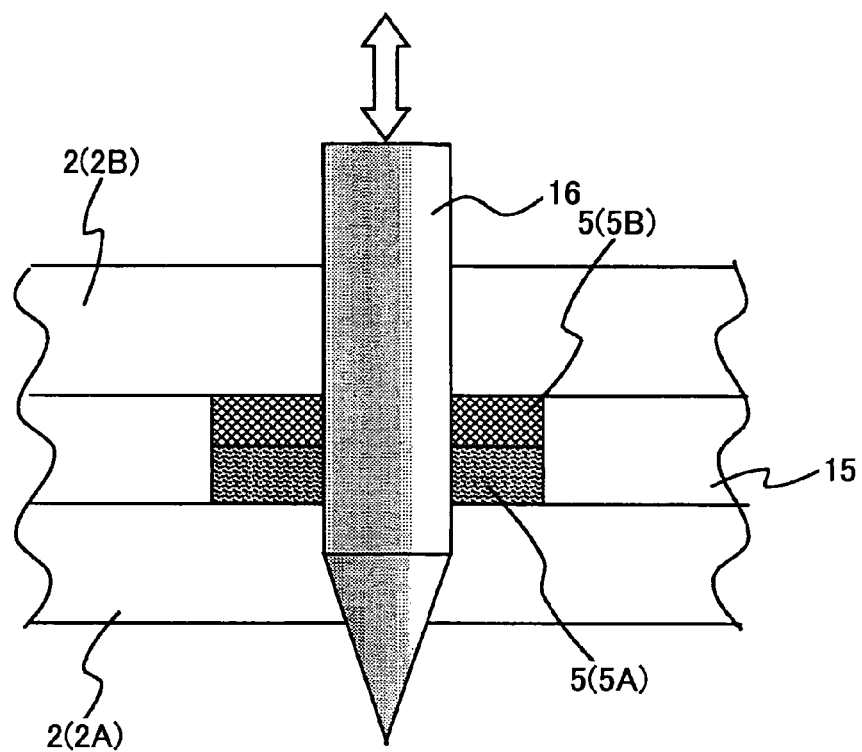
FIGS. 11A and 11B are diagrams showing an example of connection between the coil patterns.
Figure 11B:
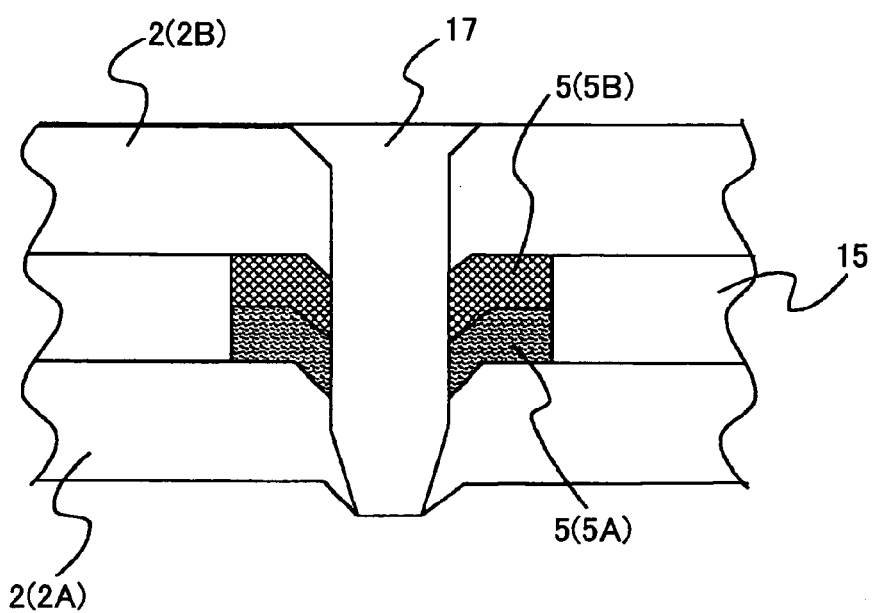

Alternatively, it is possible to form a hole 17 in the overlapping parts of the insulation sheet 2 in correspondence to the overlapping conductor patterns of the coil pattern 5 as shown in FIG. 11B by using a sharp pointed tool 16 shown in FIG. 11A, such that the upper and lower conductor patterns of the coil pattern 5 are pressed together at the time of the electric connection.

In the latter case, it should be noted that the mutually pressing state of the upper and lower conductor patterns is maintained even when the sharply pointed tool 16 is removed, in view of the fact that there is formed a layer of adhesive 15 around the coil pattern 5 as shown in FIG. 11B.

Because the insulation sheet 2 covers the semiconductor chip 3 entirely as shown in FIG. 2 as a result of folding thereof in addition to formation of the antenna coil, there is no need of accommodating the RFID tag 1 further into a case and apply resin sealing.

Thereby, it becomes possible to construct the RFID tag with reduced thickness and with flexibility with the present invention, contrary to the conventional RFID tags.

As a result, it becomes possible to attaché the RFID tag also to thin and flexible materials in which use of conventional RFID tag has been difficult.

Further, because there is caused remarkable decrease in the number of parts and the number of the steps, and it becomes possible with the present invention to reduce the cost significantly. Further, there is no need of soldering the antenna coil, and reliability of the RFID tag is improved.

Second Embodiment

Next, a second embodiment of the present invention will be explained, wherein those parts corresponding to the parts described previously are designated by the same reference numerals and the description thereof will be omitted.

Figure 4:
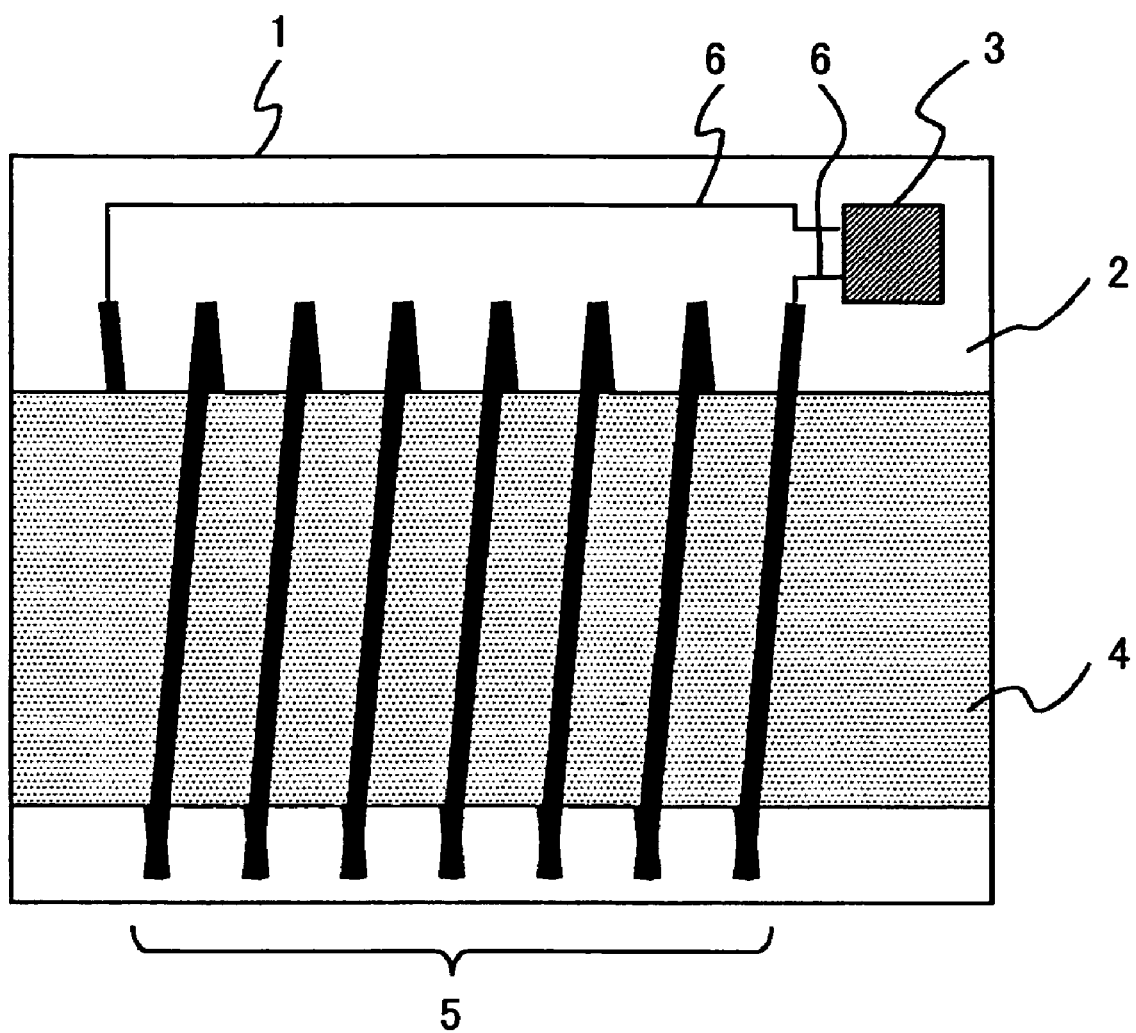
FIG. 4 is a diagram showing the construction of an RFID tag according to a second embodiment that worked the present invention.
Figure 5:
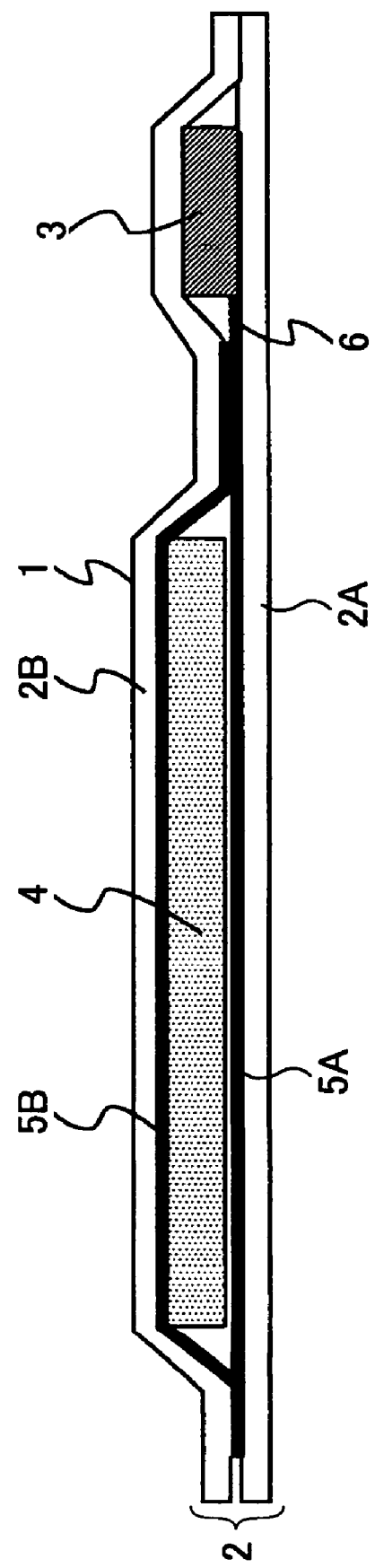
FIG. 5 is a diagram showing the construction of an edge surface of the RFID tag of the second embodiment.
Figure 6A:
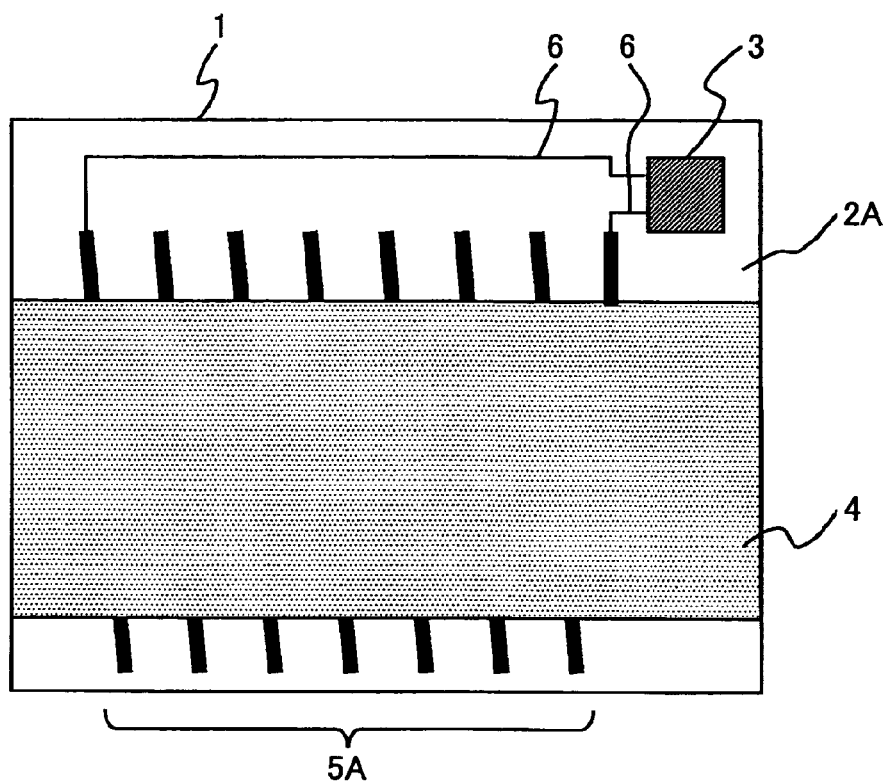
FIGS. 6A and 6B are diagrams showing the RFID tag of the second embodiment in the state before completion of assembling.
Figure 6B:
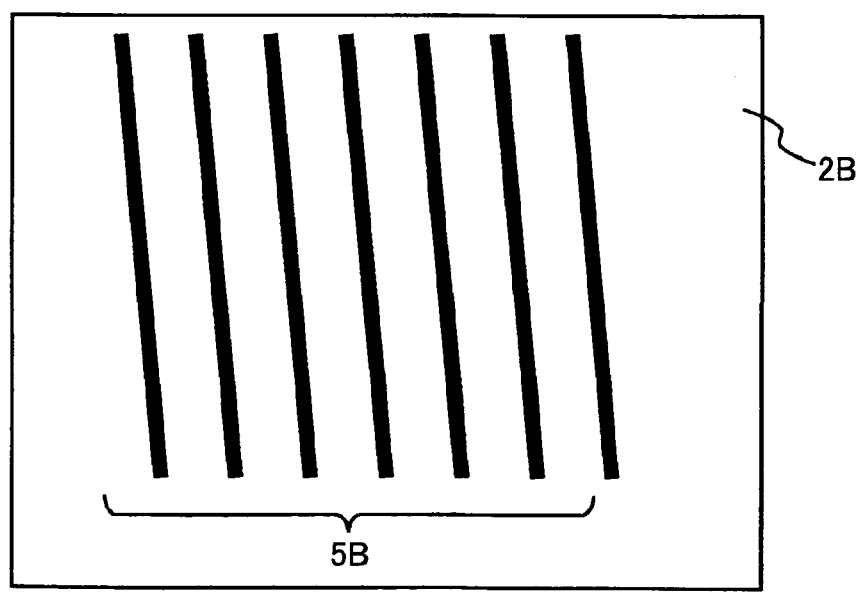

FIG. 4 shows the construction of an RFID tag according to the present embodiment, while FIG. 5 shows the cross-section of the RFID tag of the present embodiment.

Referring to FIGS. 4 and 5, the RFID tag of the present embodiment has a generally identical construction to the RFID tag of the first embodiment, except that the insulation sheet 2 is now formed of a lower insulation sheet 2A and an upper insulation sheet 2B.

Thus, with the present embodiment, the coil pattern 5 is also divided into a lower coil pattern part 5A provided on the lower insulation sheet 5A and an upper coil pattern part 5B provided on the upper insulation sheet 5B.

Assembling of the RFID tag 1 of the present embodiment is conducted similarly to the case of the first embodiment, except that the lower insulation sheet 2A and the upper insulation sheet 2B are put together in place of folding a single insulation sheet 2. In such a process of placing the upper insulation sheet 2A over the lower insulation sheet 2B, it should be noted that the upper sheet 2B is aligned with regard to the lower sheet 2A such that an end of a conductor pattern forming a part of the lower coil pattern 5A is connected to an end of a next conductor pattern of the coil pattern 5 forming a part of the upper coil pattern 5B electrically.

With the RFID of the present embodiment, too, similar effects to those of the first embodiment are attained.

Third Embodiment

Next, a third embodiment of the present invention will be described.

Figure 7:
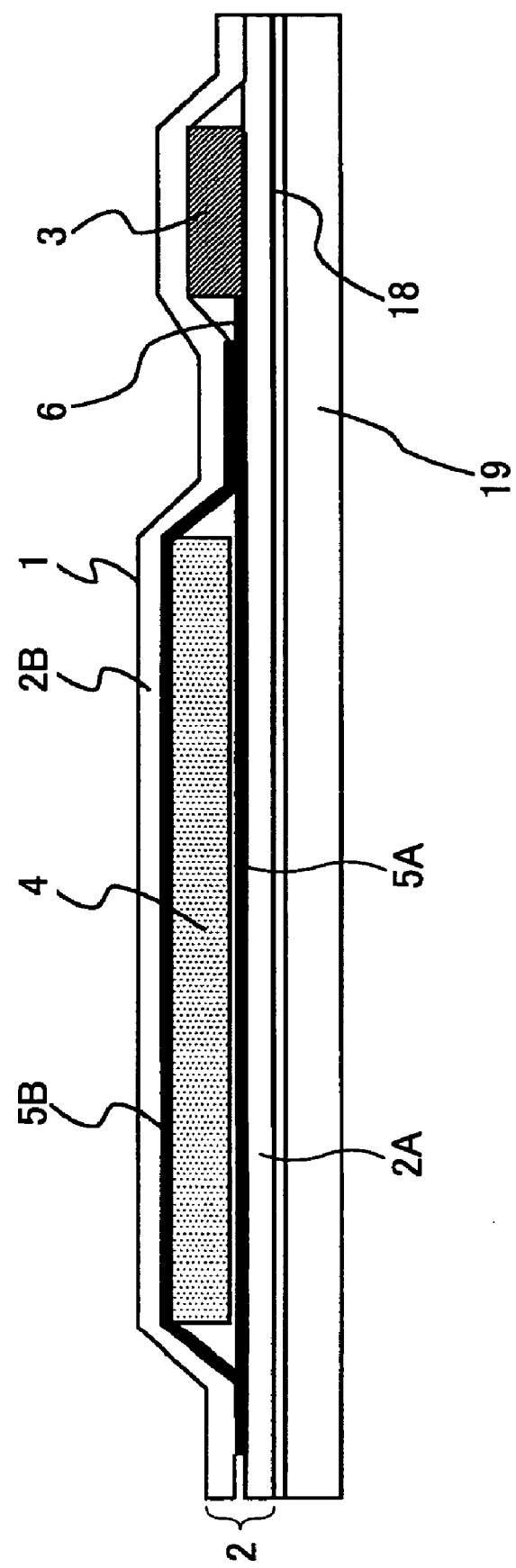
FIG. 7 is a diagram showing the construction of an RFID tag according to a third embodiment of the present invention.

FIG. 7 shows the construction of the RFID tag according to the third embodiment of the present invention, wherein those parts corresponding to the parts described previously are designated by the same reference numerals and the description thereof will be omitted.

Referring to FIG. 7, the RFID tag of the present embodiment has a construction similar to that of the RFID tag of the second embodiment, except that there is provided a thermal paper 19 on a flat surface of the RFID tag via an adhesion layer 18.

Here, it should be noted that the thermal paper 19 is a rewritable thermal paper while the adhesive layer 18 may be formed by applying a sticking layer or a both-side adhesive film.

With the use of such a rewritable thermal paper 19, in which the part applied with heat changes dark, it is possible to represent or display characters or images by using a thermal print head. Further, such characters or images can be erased easily. Thus, it is possible with the present embodiment to rewrite the visual information repeatedly.

By printing a part of the information stored in the RFID tag 1, it becomes possible with the present invention to confirm the information stored in the RFID tag 1 visually, without using a reader/write device.

In the event of rewriting the information stored in the RFID tag 1, the information represented on the thermal paper 19 is erased once, and new information is printed in correspondence to the updated information stored in the RFID tag 1. With this, it becomes possible to confirm the latest information stored in the RFID tag 1.

Further, the present invention is by no means limited to the embodiments described heretofore, but various variations and modifications may be made without departing from the scope of the invention.

Figure 12:
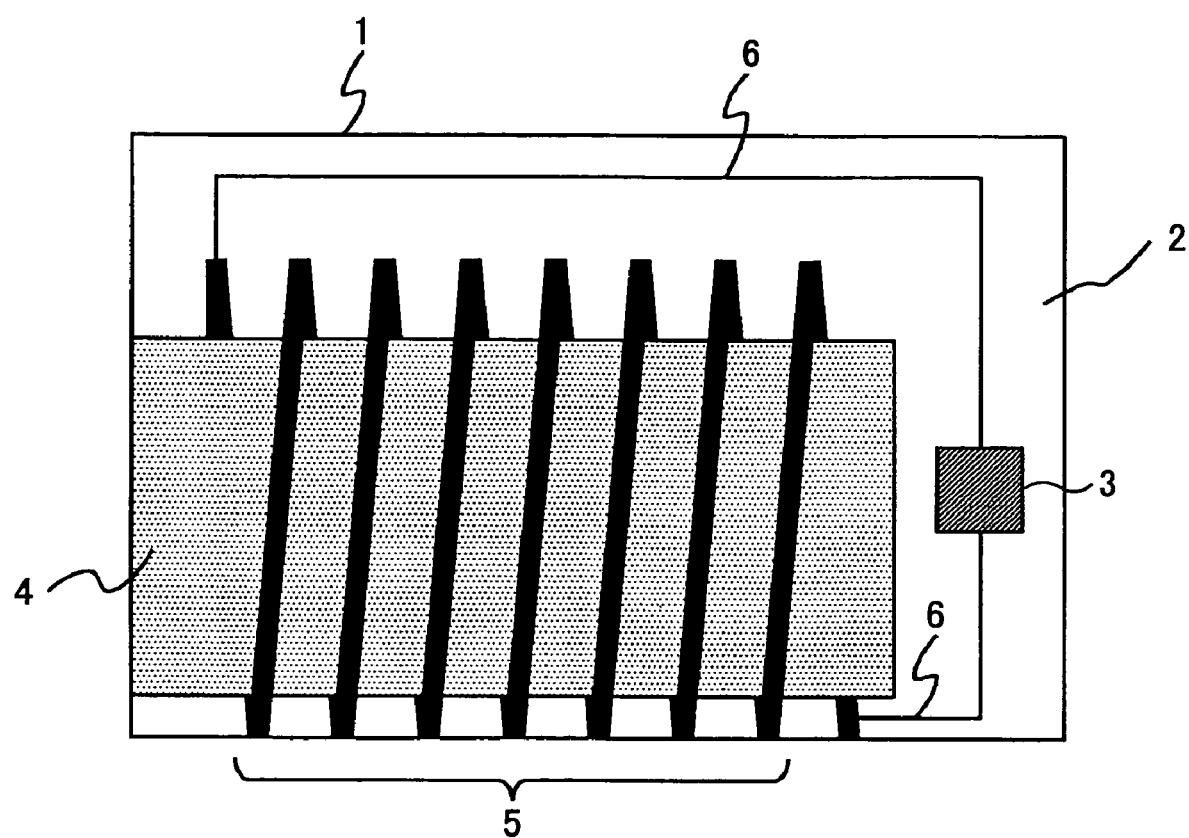
FIG. 12 is a diagram showing a modification of the location where the magnetic core member and the semiconductor chip are disposed.
Figure 13A:
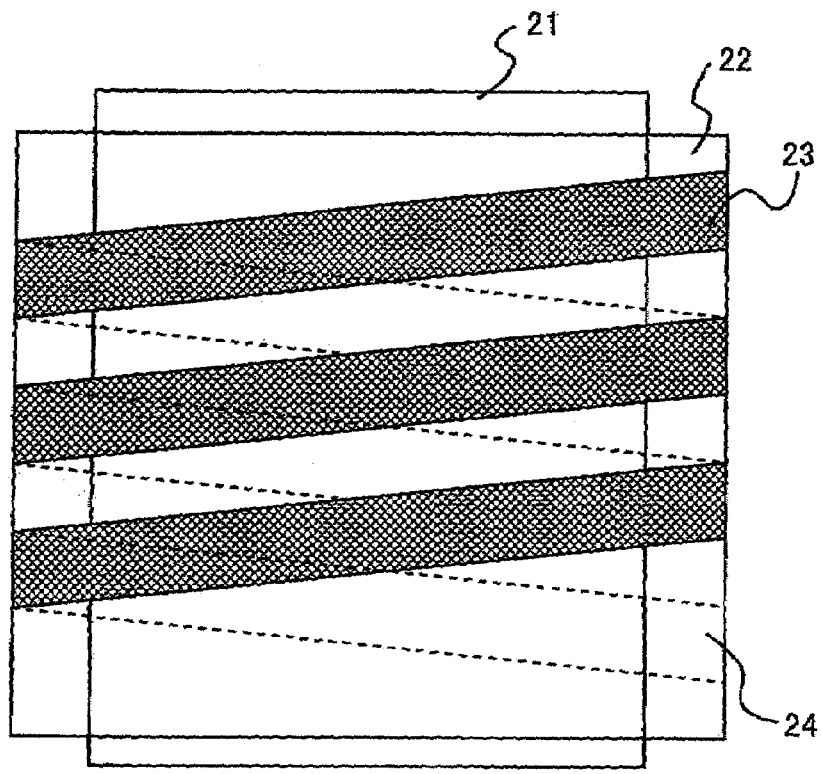
FIGS. 13A and 13B are diagrams showing the construction of a conventional RFID tag.
Figure 13B:
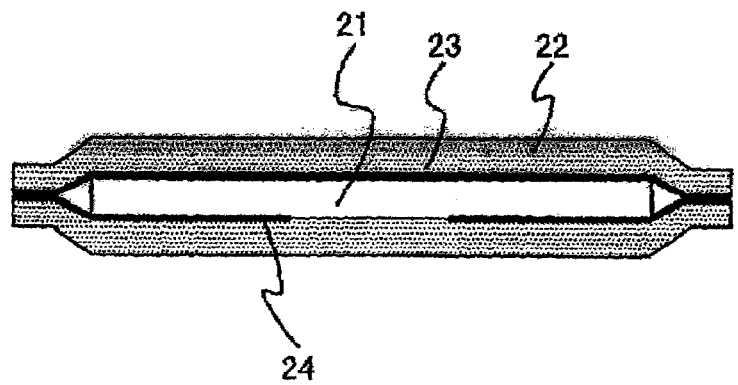
Figure 14A:
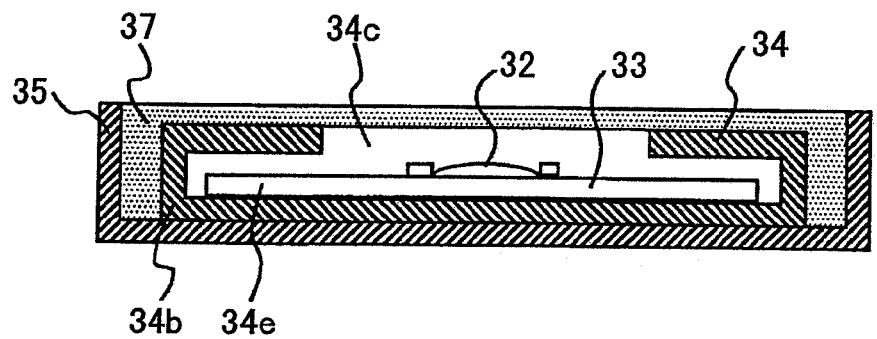
FIGS. 14A and 14B are diagrams showing the construction of a conventional RFID tag.
Figure 14B:
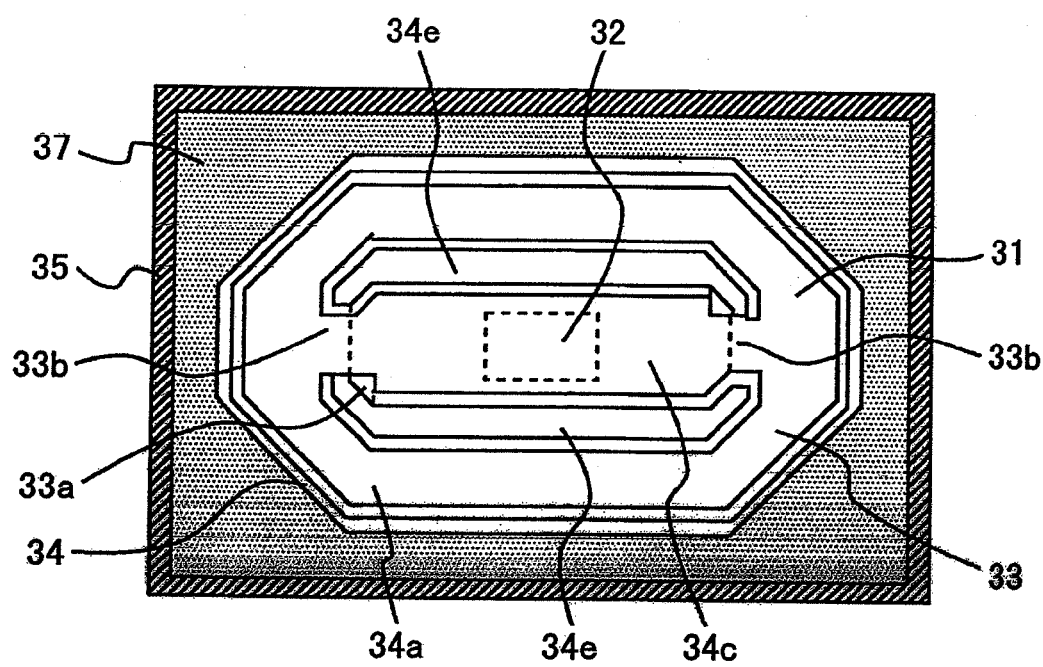

For example, while the explanation has been made in the previous embodiments with regard to the case in which the magnetic core member is disposed close to the creasing line and the semiconductor chip 3 is disposed in the vicinity of the part where the edges of the insulation film are put together, it is also possible to dispose the semiconductor chip 3 close to the creasing line as shown in FIG. 12, showing a modification of the first embodiment.

The present invention is based on Japanese priority application No. 2005-222415 filed on Aug. 1, 2005, which is incorporated herein as reference.

What is claimed is:

1. An RFID tag, comprising:
  a semiconductor chip storing therein information of an object to be discriminated and carrying out radio communication with a reader/writer device; and
  an antenna coil provided with a magnetic core member and connected electrically to said semiconductor chip,
  said semiconductor chip and said magnetic core member being wrapped by an insulation sheet carrying an interconnection pattern connecting a pad of said semiconductor chip and said antenna coil electrically and plural coil patterns on one side thereof,
  said plural coil patterns including bar-shaped conductor patterns formed obliquely to said magnetic core member, each of said bar-shaped conductor patterns having an end connected to an end of an adjacent coil pattern, said bar-shaped conductor patterns thereby forming together a spiral coil around said magnetic core member,
  said coil patterns being connected with each other at a part where said coil patterns overlap with each other,
  said insulation sheet carrying said magnetic core member at said one side in a part of a surface of said insulation sheet, said insulation sheet further carrying said semiconductor chip at said one side in a different part of said surface not carrying said magnetic core member, and said insulation sheet forming at least a part of the exterior surface of the RFID tag, and each of said bar-shaped conductor patterns having a hole at said part where said coil patterns overlap with each other, said hole penetrating through each of said bar-shaped conductor patterns and at least a part of said insulation sheet on each side of said overlapping coil patterns.

2. The RFID tag as claimed in claim 1, wherein said semiconductor chip and said magnetic core member are wrapped by a single sheet of said insulation sheet, said insulation sheet carrying said conductor patterns and said semiconductor chip on an inner surface thereof.

3. The RFID tag as claimed in claim 1, wherein said insulation sheet comprises a lower insulation sheet carrying thereon a part of said coil pattern and said interconnection pattern and an upper insulation sheet carrying a remaining part of said coil pattern,
  said upper insulation sheet and said lower insulation sheet being put together such that a surface of said lower insulation sheet carrying said semiconductor chip and said coil pattern and a surface of said upper insulation sheet carrying said coil pattern form together an inner surface wrapping said semiconductor chip and said magnetic core member.

4. An REID tag, comprising:
  a semiconductor chip holding therein information of an object to be discriminated and carrying out radio communication with a reader/writer device; and
  an antenna coil provided with a magnetic core member and connected electrically to said semiconductor chip,
  said semiconductor chip and said magnetic core member being wrapped by an insulation sheet carrying thereon an interconnection pattern and plural coil patterns, said interconnection pattern connecting a pad on said semiconductor chip and said antenna coil electrically,
  said insulation sheet being folded around said semiconductor chip and said magnetic core member in such a manner that said interconnection pattern and said coil patterns are carried on an inner side of said insulation sheet,
  each of said plural coil patterns having a bar-shaped form and disposed so as to extend across said magnetic core member in an oblique direction with regard to a crease line formed on said folded insulation sheet,
  said plural coil patterns forming together a spiral around said magnetic core member by overlapping an end thereof with an end of an adjacent coil pattern,
  each of said plural coil patterns having said end electrically connected to said end of said adjacent coil pattern, and having a hole where said end is electrically connected to said end of said adjacent coil pattern, said hole penetrating through each of said electrically connected ends and at least a part of said insulation sheet on the outer side of each side of said coil patterns,
  said insulation sheet carrying said magnetic core member at one side in a part of a surface of said insulation sheet, said insulation sheet further carrying said semiconductor chip in a different part of said surface not carrying said magnetic core member, and said insulation sheet completely enclosing said semiconductor chip, said antenna coil, said magnetic core member, and said interconnection pattern.

5. The RFID tag as claimed in claim 4, wherein there is disposed a rewritable thermal paper at a side of said insulation sheet opposite to a side on which said semiconductor chip is mounted.

6. An RFID tag comprising:
  a semiconductor chip holding therein information of an object to be discriminated and carrying out radio communication with a reader/writer device; and
  an antenna coil provided with a magnetic core member and connected electrically to said semiconductor chip,
  said semiconductor chip and said magnetic core member being wrapped by a first insulation sheet and a second insulation sheet that are put together, said first insulation sheet carrying, on an inner surface thereof, an interconnection pattern for connecting a pad of said semiconductor chip to said antenna coil and plural first coil patterns constituting said antenna coil, said second insulation sheet carrying, on an inner surface thereof, plural coil patterns constituting a part of said antenna coil, each of said first and second coil patterns comprising a bar-shaped conductor pattern extending across said magnetic core member obliquely, each of said bar-shaped conductor patterns constituting said first coil patterns having a first end and a second, opposite end such that said first end overlaps with a corresponding end of an adjacent bar-shaped conductor pattern forming said second coil patterns and such that said second end overlaps with a corresponding end of another adjacent bar-shaped conductor pattern forming said second coil patterns, said first and second coil patterns forming thereby a spiral around said magnetic core member, each of said bar-shaped conductor patterns constituting said first and second coil patterns being connected electrically to respective, adjacent bar-shaped conductor patterns at said first end and at said second end, each of said first ends and said second ends having a hole where each of said first ends and said second ends are connected electrically, said hole penetrating through each of said first ends and said second ends and at least a part of each of said insulation sheets, said insulation sheets carrying said magnetic core member at one side, said insulation sheets further carrying said semiconductor chip in a part not carrying said magnetic core member, and said insulation sheet forming at least a part of the exterior surface of the RFID tag.

7. The RFID tag as claimed in claim 6, wherein there is disposed a rewritable thermal paper at a surface opposite to a surface of said second insulation sheet put to said first insulation sheet.

8. A method of manufacturing an RFID tag, said RFID tag comprising a semiconductor chip holding therein information of an object to be discriminated and carrying out radio communication with a reader/writer device, and an antenna coil provided with a magnetic core member and connected electrically to said semiconductor chip, said method comprising the steps of:

forming, on a surface of an insulation sheet, an interconnection pattern for connecting a pad of said semiconductor chip to said antenna coil and bar-shaped coil patterns constituting said antenna coil;

connecting said pad of said semiconductor chip to said interconnection pattern electrically;

applying an adhesive to said surface of said insulation sheet on which said interconnection pattern and said coil patterns are formed;

disposing a magnetic core member on a predetermined location of said insulation sheet so as to form a predetermined angle with regard to said bar-shaped coil patterns and so as to avoid a region occupied by said semiconductor chip;

wrapping said semiconductor chip and magnetic core member by said insulation sheet such that said surface of said insulation sheet, on which said interconnection pattern and said bar-shaped coil patterns are formed, forms an inner surface;

connecting overlapping parts of said bar-shaped coil patterns electrically such that there is formed a coil wound around said magnetic core member by said bar-shaped coil patterns as said antenna coil;

adhering said insulation sheet to said semiconductor chip and said magnetic core member under pressure;

completely enclosing with said insulation sheet said semiconductor chip, said antenna coil, said magnetic core member, and said interconnection pattern; and forming a hole using a sharp pointed tool through each of said overlapping parts of said bar-shaped coil patterns, said hole penetrating through each of said overlapping parts of said bar-shaped coil patterns and at least a part of said insulation sheet on each side of said overlapping parts of said bar-shaped coil patterns.

9. The method as claimed in claim 8, wherein further comprising a step of disposing a rewritable thermal paper on a surface of the insulation sheet opposite to the surface on which the semiconductor chip is mounted.

10. A method of manufacturing an RFID tag, said RFID tag comprising a semiconductor chip holding therein information of an object to be discriminated and carrying out radio communication with a reader/writer device, and an antenna coil provided with a magnetic core member and connected electrically to said semiconductor chip, said method comprising the steps of:

forming, on a surface of a first insulation sheet, an interconnection pattern for connecting a pad of said semiconductor chip to said antenna coil and plural first coil patterns constituting a part of said antenna coil;

forming plural second coil patterns constituting a part of said antenna coil on a surface of a second insulation sheet;

connecting a pad of said semiconductor chip and said interconnection pattern;

applying an adhesive to said surface of said first insulation sheet on which said first coil patterns are formed and to said surface of said second insulation sheet on which said second coil patterns are formed;

disposing a magnetic core member to a predetermined location of said first and second insulation sheets such that said first and second coil patterns form a predetermined angle with regard to said magnetic core member and so as to avoid a region occupied by said semiconductor chip;

putting said first and second insulation sheets together and wrapping said semiconductor chip and said magnetic core member by said first and second insulation sheets such that said surface of said first insulation sheet on which said first coil patterns are formed and said surface of said second insulation sheet on which said second coil pattern are formed form an inner surface; and connecting said first and second coil patterns at respective end parts where said first and second coil patterns overlap with each other, such that said antenna coil formed of said first and second coil patterns is wound around said magnetic core member; and adhering said first insulation sheet and said second insulation sheet to said magnetic core member under pressure, wherein said first insulation sheet and said second insulation sheet form at least a part of the exterior surface of the RFID tag; and forming a hole using a sharp pointed tool through each of said respective end parts where said first and second coil patterns overlap with each other, said hole penetrating through each of said respective end parts and at least a part of said insulation sheet on each side of said respective end parts.

11. The method as claimed in claim 10, further comprising a step of disposing a rewritable thermal paper on a surface of said second insulation sheet opposite to a surface on which said first insulation sheet is adhered under pressure.

* * * * *